(12) United States Patent
Rolfson

(10) Patent No.: US 6,187,481 B1
(45) Date of Patent: *Feb. 13, 2001

(54) SEMICONDUCTIVE MATERIAL STENCIL MASK AND METHODS OF MANUFACTURING STENCIL MASKS FROM SEMICONDUCTIVE MATERIAL, UTILIZING DIFFERENT DOPANTS

(75) Inventor: J. Brett Rolfson, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/137,662

(22) Filed: Aug. 20, 1998

(51) Int. Cl.$^7$ ........................................... G03F 9/00
(52) U.S. Cl. .................................................. 430/5
(58) Field of Search ....................... 430/5, 315; 438/518, 438/519, 521, 524, 527, 529

(56) References Cited

U.S. PATENT DOCUMENTS

| | | | | |
|---|---|---|---|---|
| 4,013,502 | * | 3/1977 | Staples | 156/608 |
| 4,448,865 | * | 5/1984 | Bohlen et al. | 430/5 |
| 4,868,134 | | 9/1989 | Kasahara | 437/27 |
| 4,906,591 | * | 3/1990 | Okumura | 438/252 |
| 5,032,534 | * | 7/1991 | Ducreuz | 438/10 |
| 5,130,271 | * | 7/1992 | Migita | 437/147 |
| 5,143,857 | * | 9/1992 | Finchem et al. | 438/181 |
| 5,223,442 | * | 6/1993 | Kitagawa et al. | 437/6 |
| 5,453,387 | * | 9/1995 | Hayashi | 438/374 |
| 5,482,873 | * | 1/1996 | Yang | 438/365 |
| 5,672,449 | * | 9/1997 | Loschner et al. | 435/5 |
| 5,731,218 | * | 3/1998 | Melzner et al. | 438/239 |
| 5,770,336 | * | 6/1998 | Choi | 430/5 |
| 5,795,801 | | 8/1998 | Lee | 438/199 |
| 5,937,287 | * | 8/1999 | Gonzalez | 438/220 |

* cited by examiner

Primary Examiner—Christopher G. Young
Assistant Examiner—Saleha R. Mohamedulla
(74) Attorney, Agent, or Firm—Wells, St. John, Roberts, Gregory & Matkin

(57) ABSTRACT

In one aspect, the invention includes a method of maintaining dimensions of an opening in a semiconductive material stencil mask comprising providing two different dopants within a periphery of the opening, the dopants each being provided to a concentration of at least about $10^{17}$ atoms/cm$^3$. In another aspect, the invention includes a method of manufacturing a stencil mask from a semiconductive material comprising: a) providing a semiconductive material wafer, the wafer comprising an upper portion and a lower portion beneath the upper portion; b) forming openings extending through the upper portion of the wafer and to the lower portion of the wafer; c) forming a first dopant concentration within the wafer, the first dopant concentration being greater within the upper portion of the wafer than within at least a part of the lower portion of the wafer; d) providing a second dopant concentration within the upper portion of the wafer; and e) removing the lower portion of the wafer to leave a stencil mask substrate having openings formed therethrough. In yet another aspect, the invention comprises a semiconductive material stencil mask comprising: a) a semiconductive material substrate having an opening therethrough, the opening being defined by a periphery comprising the semiconductive material; and b) two different dopants within the semiconductive material at the periphery, the two different dopants being of a same conductivity type.

38 Claims, 4 Drawing Sheets

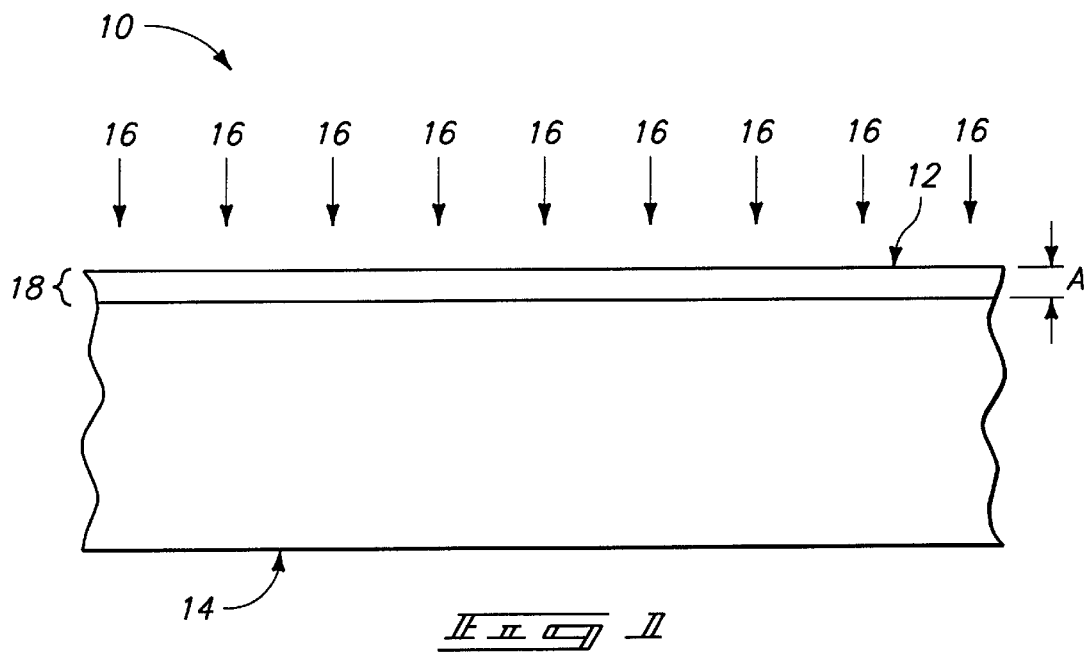
$\overline{\underline{F\ \underline{I}\ \underline{G}}}\ \underline{\mathbb{I}}$
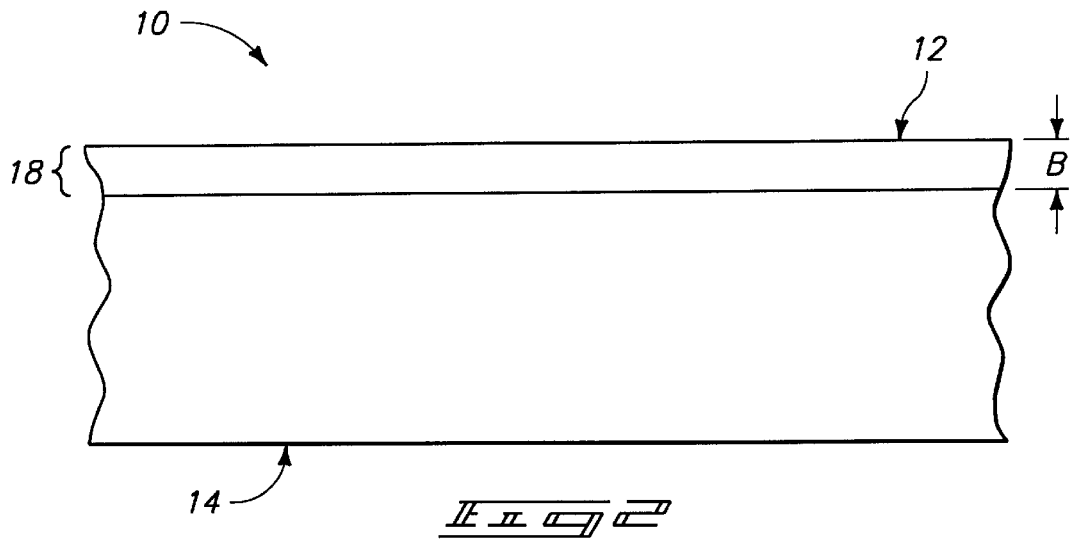
$\overline{\underline{F\ \underline{I}\ \underline{G}}}\ \underline{2}$

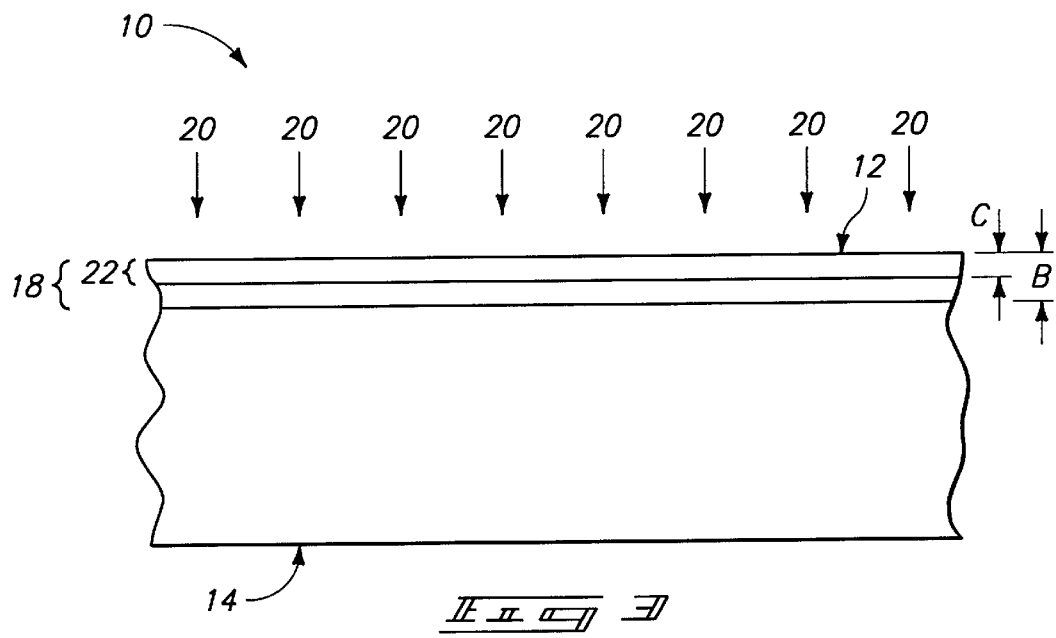
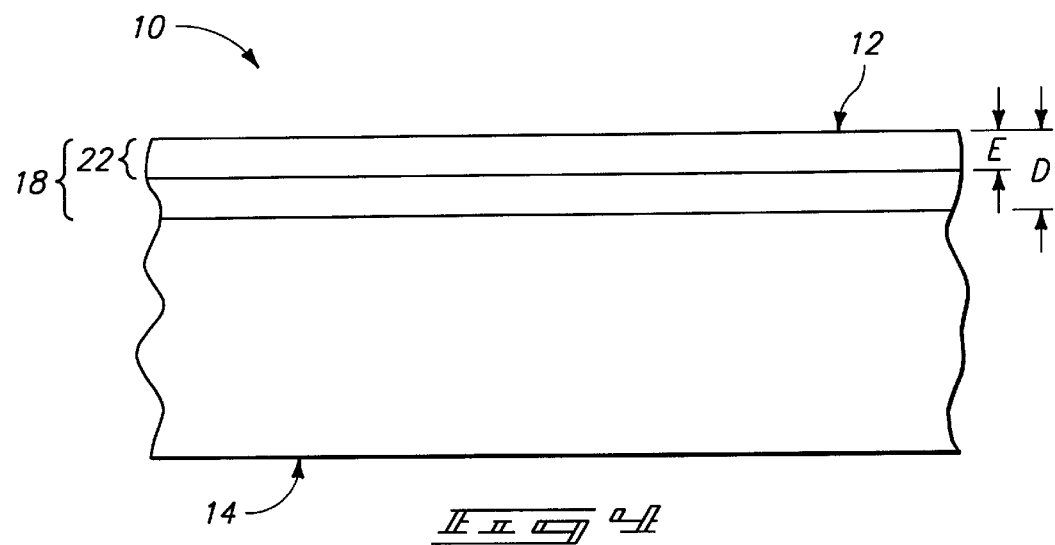

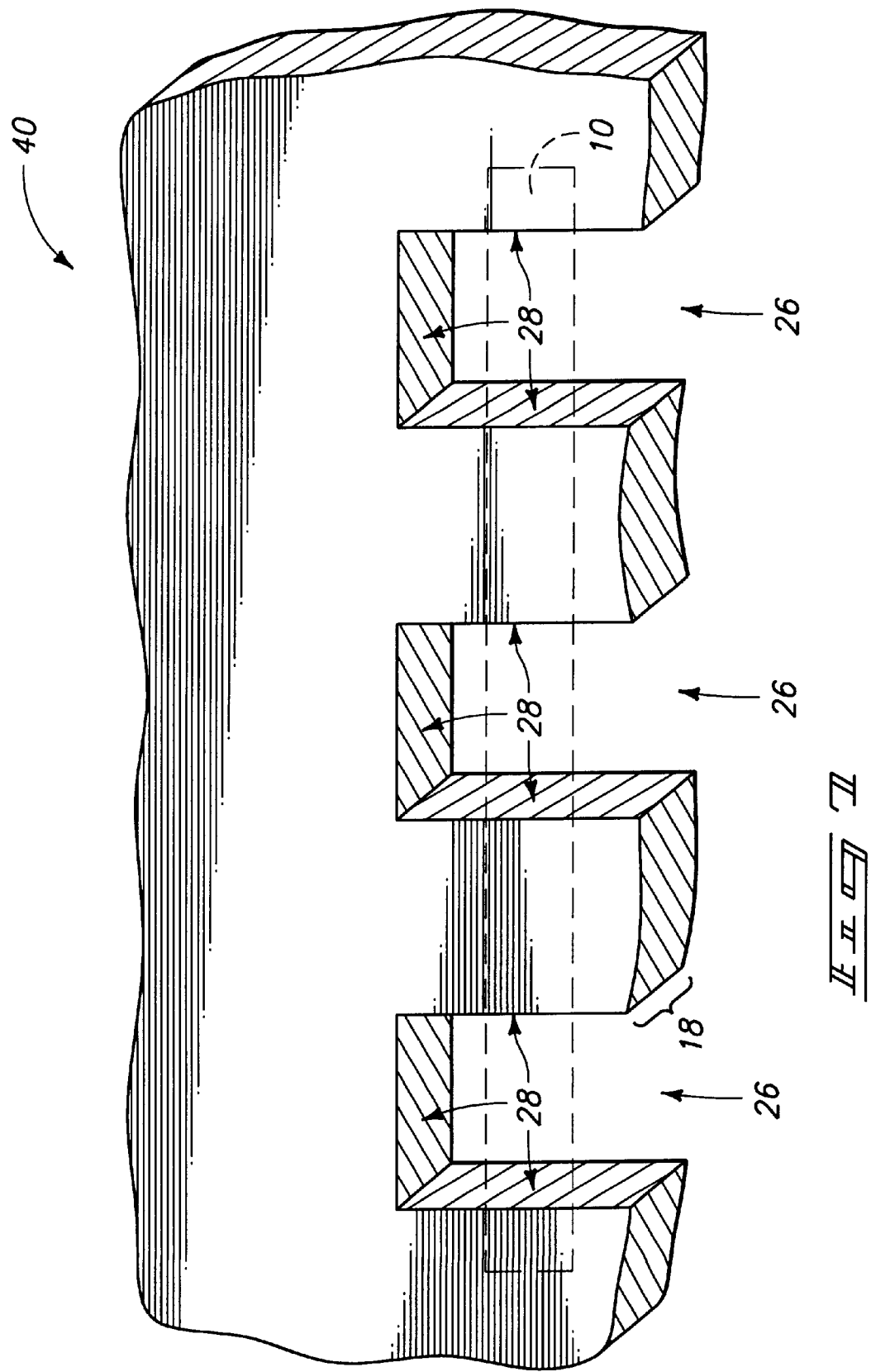

SEMICONDUCTIVE MATERIAL STENCIL MASK AND METHODS OF MANUFACTURING STENCIL MASKS FROM SEMICONDUCTIVE MATERIAL, UTILIZING DIFFERENT DOPANTS

TECHNICAL FIELD

The invention pertains to semiconductive material stencil masks, and to methods of forming semiconductive material stencil masks.

BACKGROUND OF THE INVENTION

Ion and electron beam lithographic systems utilize a stencil mask to pattern a resist-coated target. These stencil masks typically comprise a substrate having a pattern of openings formed therethrough. Commonly, the substrate will be formed of silicon. However, other deposited or grown materials, such as SiC, SiN and BN can also be used to form at least a portion of the substrate.

The formation of a pattern of openings extending through substrates comprising silicon, SiC, SiN and/or BN can be quite challenging as said substrates are frequently thin and brittle. Accordingly, it would be desirable to develop alternative methods of forming a pattern of openings within such substrates.

Additionally, it can be challenging to maintain the dimension of an opening formed in a thin substrate comprising silicon, SiC, SiN and/or BN, as the material around such openings tends to easily deform (i.e., warp, bow or otherwise alter its shape after formation of the openings). Such deformations can undesirably change the dimensions of the openings and thus alter a pattern of openings formed in a stencil mask substrate. Accordingly, it is desirable to develop methods of maintaining a pattern of openings within a stencil mask substrate.

SUMMARY OF THE INVENTION

In one aspect, the invention encompasses a method of maintaining dimensions of an opening in a semiconductive material stencil mask. Two different dopants are provided within a periphery of the opening, with the dopants each being provided to a concentration of at least about $10^{17}$ atoms/cm$^3$.

In another aspect, the invention encompasses a method of manufacturing a stencil mask from a semiconductive material. A semiconductive material stencil mask substrate is provided. The substrate has openings formed through it and has a background dopant concentration. A first dopant is provided within the substrate. The first dopant is provided to a concentration which exceeds the background dopant concentration. A second dopant is provided within the substrate. The second dopant is provided to a concentration which exceeds the background dopant concentration.

In another aspect, the invention encompasses a semiconductive material stencil mask. The stencil mask includes a semiconductive material substrate having an opening therethrough. The opening is defined by a periphery comprising the semiconductive material. The stencil mask further includes two different dopants within the semiconductive material at the periphery. The two different dopants are of a same conductivity type as one another.

BRIEF DESCRIPTION OF THE DRAWINGS

Preferred embodiments of the invention are described below with reference to the following accompanying drawings.

FIG. 1 is a fragmentary, diagrammatic, cross-sectional view of a semiconductor wafer being processed according to a method of the present invention.

FIG. 2 is a view of the FIG. 1 wafer fragment at a processing step subsequent to that of FIG. 1.

FIG. 3 is a view of the FIG. 1 wafer fragment at a processing step subsequent to that of FIG. 2.

FIG. 4 is a view of the FIG. 1 wafer fragment at a processing step subsequent to that of FIG. 3, processed according to a first embodiment method of the present invention.

FIG. 7 is an isometric view of a stencil mask comprising the FIG. 1 wafer fragment, shown at a processing step subsequent to that of FIG. 6.

DETAILED DESCRIPTION OF THE PREFERRED EMBODIMENTS

Figure 5:
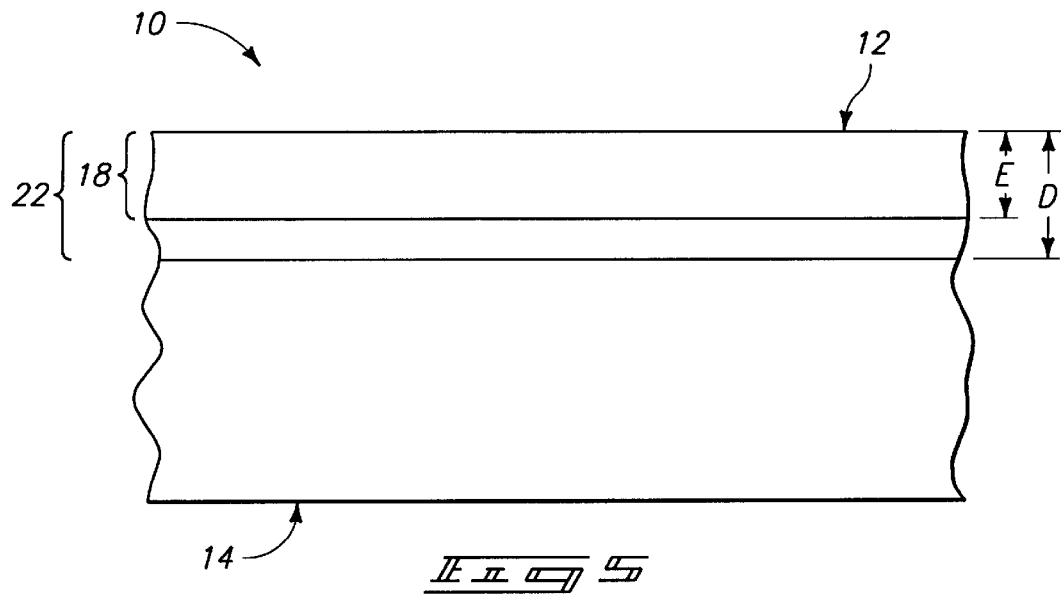
FIG. 5 is a view of the semiconductor wafer fragment of FIG. 1 shown at a processing step subsequent to that of FIG. 3, processed according to a second embodiment method of the present invention.

This disclosure of the invention is submitted in furtherance of the constitutional purposes of the U.S. Patent Laws "to promote the progress of science and useful arts" (Article 1, Section 8).

FIG. 1 illustrates a semiconductive material wafer fragment 10 at a preliminary processing step of a method of the present invention. Wafer fragment 10 can comprise, for example, monocrystalline silicon lightly and uniformly doped with a background dopant. A typical background dopant is a p-type dopant provided to a concentration of from about $10^{12}$ to about $10^{16}$ atoms/cm$^3$. Wafer fragment 10 is utilized to form a stencil mask, and can, therefore, alternatively be referred to as a semiconductive material stencil mask substrate.

Wafer fragment 10 comprises a top surface 12 and a bottom surface 14. A first dopant 16 is blanket implanted into an entirety of top surface 12 of wafer fragment 10 to form a first doped region 18 within wafer fragment 10. Doped region 18 defines a doped upper portion which extends to a depth "A" within wafer fragment 10. First dopant 16 can comprise either an n-type dopant or a p-type dopant, but preferably comprises an n-type dopant. First dopant 16 preferably comprises a dopant having an atomic radii larger than an atomic radii of the semiconductive material of wafer fragment 10. For instance, if wafer fragment 10 comprises silicon (atomic radii 132 picometers), then a preferred dopant is arsenic (atomic radii 139 picometers). The arsenic will preferably be implanted to a concentration of at least about $10^{17}$ atoms/cm$^3$, and to a depth "A" of from about 0.1 to about 1 microns.

Referring to FIG. 2, wafer fragment 10 is thermally treated to diffuse first dopant 16 to a second depth "B", and to thereby extend first doped region 18. Depth "B" will preferably be from about 1 microns to about 8 microns. The thermal processing can comprise, for example, heating wafer fragment 10 to a temperature of at least about 800° C. for a time of about 30 minutes.

Referring to FIG. 3, a second dopant 20 is blanket implanted into an entirety of top surface 12 of semiconductor wafer fragment 10 to form a second doped region 22. Second dopant 20 can comprise either an n-type dopant or a p-type dopant, but preferably comprises a p-type dopant.

Second dopant 20 preferably comprises an atomic radii smaller than the atomic radii of the semiconductive material of wafer fragment 10. For instance, if wafer fragment 10 comprises silicon (atomic radii 132 picometers), then second dopant 20 can preferably comprise, for example, the n-type dopant phosphorus (atomic radii 128 picometers) or the p-type dopant boron (atomic radii 98 picometers). Second dopant 20 is preferably provided to a concentration of about $10^{17}$ atoms/cm$^3$ and to a depth "C" which is less than depth "B". Depth "C" will preferably be from about 2 microns to about 10 microns.

Referring to FIG. 4, wafer fragment 10 is thermally treated to diffuse first dopant 16 and second dopant 20 to depths "D" and "E", respectively. Accordingly, the thermal processing expands regions 18 and 22. Suitable thermal processing can comprise, for example, rapid thermal processing to a temperature of 930° C., which is maintained for about 20 seconds. Such rapid thermal processing can advantageously activate dopants 16 and 20, as well as diffusing the dopants within wafer fragment 10.

In preferred embodiments in which dopant 20 is smaller than dopant 16, dopant 20 will diffuse further than dopant 16 in the above-described thermal processing. In the embodiment illustrated in FIG. 4, the rapid thermal processing has been conducted for a relatively short time, such that dopant 22 has migrated to a depth "E" which is less than the depth "D" to which larger dopant 16 has diffused. FIG. 5 illustrates an alternate embodiment in which thermal processing is conducted for a sufficient time to enable smaller dopant 20 to diffuse to a depth "E" which is greater than the depth "D" to which larger dopant 16 diffuses. Thus, in the embodiment of FIG. 4, second dopant region 22 is smaller than first dopant region 18, while in the embodiment of FIG. 5, the relative sizes of such dopant regions is reversed.

As will become apparent from the discussion below, a thickness of a stencil mask formed from wafer fragment 10 will be determined, at least in part, by a thickness of an n-type diffusion region formed at an upper portion of wafer fragment 10. Accordingly, in preferred embodiments in which first dopant 16 comprises an n-type dopant, and in which second dopant 20 comprises a p-type dopant, a thickness of a stencil mask formed from wafer fragment 10 will be approximately equal to the thickness of first doped region 18, regardless of whether thermal processing proceeds according to the embodiment of FIG. 4 or the embodiment of FIG. 5. Alternatively, if first and second dopants 16 and 20 both comprise n-type dopants, a thickness of a stencil mask formed from wafer fragment 10 will vary depending upon whether thermal processing proceeds according to the embodiment of FIG. 4 or the embodiment of FIG. 5. Specifically, in the embodiment of FIG. 4, a stencil will have a thickness corresponding to about the thickness of first doped portion 18, whereas in the embodiment of FIG. 5 the stencil will have a thickness of about the thickness of second doped portion 22. As it is easier to control diffusion of a slower-moving large dopant than that of a faster-moving smaller dopant, the embodiment of FIG. 4 is preferred when both first dopant 16 and second dopant 20 are n-type dopants. If first dopant 16 is an n-type dopant and second dopant 20 is a p-type dopant, the embodiment of FIG. 5 is preferred, as this embodiment insures that first doped portion 18 is substantially uniformly doped with both first dopant 16 and second dopant 20.

It is preferred that one of dopants 16 and 20 comprise an ionic radii greater than an ionic radii of the semiconductive material of wafer fragment 10, and that the other comprise an ionic radii smaller than the ionic radii of the semiconductive material. Such combination of dopants can balance compressive and tensile forces within the semiconductive material. Specifically, dopants having ionic radii greater than the ionic radii of the semiconductive material will create compressive stress within the material, and dopants having ionic radii smaller than the semiconductive material will create tensile stress within the material. By balancing compressive and tensile stresses within the material, it is possible to avoid warping and other deformations of a stencil mask formed from the semiconductive material. Among the deformations that can occur in the substrate are bowing of an opening's peripheries either inward to decrease a width of the opening or outward to increase a width of the opening. The force created by the dopants can prevent such bowing. Also, in circumstances in which the bowing has occurred before provision of the dopants at the periphery of the opening, the forces created by the dopants can force the substrate to unbow.

Figure 6:
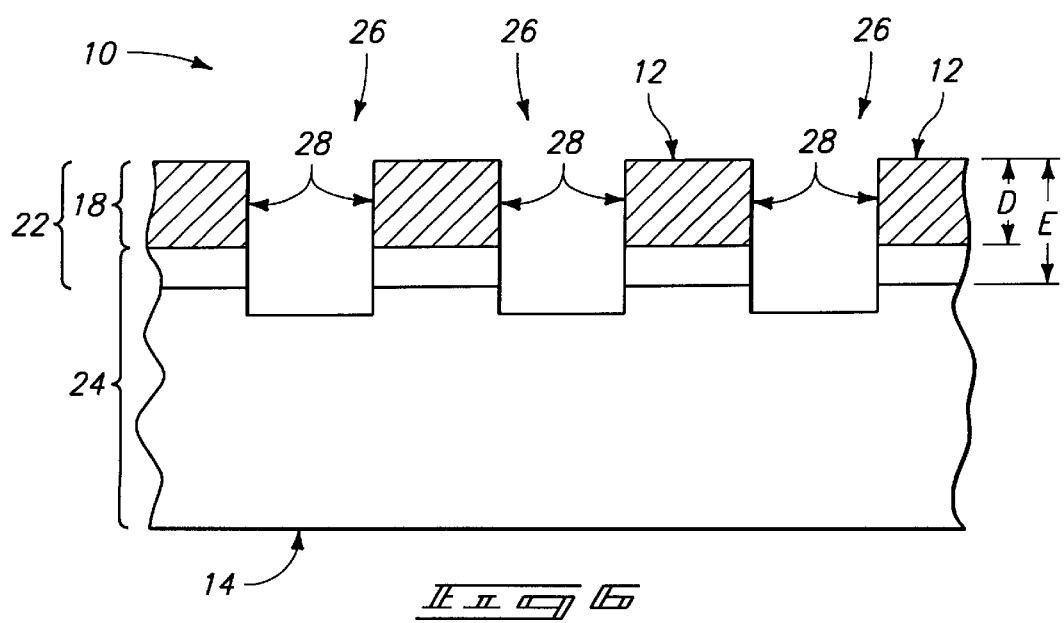
FIG. 6 is a view of the FIG. 1 wafer fragment shown at a processing step subsequent to that of FIG. 5.

Referring to FIG. 6, semiconductor wafer fragment 10 is shown after processing subsequent to the thermal processing of FIG. 5. The wafer fragment 10 is illustrated as a specific embodiment in which wafer fragment 10 is background doped with a p-type dopant, first doped region 18 is doped with an n-type dopant, and second doped region 20 is doped with a p-type dopant. First doped region 18 is illustrated with cross-hatching to indicate the different dopant type of first doped region 18 relative to the remainder of wafer fragment 10. Wafer fragment 10 can be thought of as comprising an upper portion defined by doped portion 18, and a lower portion extending from a bottom of doped portion 18 to bottom surface 14.

Openings 26 are formed through upper portion 18 and to lower portion 24. In an embodiment in which substrate 10 comprises monocystalline silicon, openings 26 can be formed by, for example, photolithographic masking and an anisotropic etch utilizing HBr and/or $Cl_2$. Openings 26 comprise peripheries 28 containing first and second dopants 16 (FIG. 1) and 20 (FIG. 3).

The methods described in FIGS. 1–6 are illustrative of a preferred process for providing two different dopants (dopants 16 and 20) at peripheries 28 of openings 26. The methods provide the dopants before forming openings 26. The invention also encompasses alternative embodiments (not shown) in which dopants are provided after forming openings 26. Such alternative methods can comprise, for example, angled implants of one or both of dopants 16 and 20 into peripheries 28 after forming openings 26.

As shown in FIG. 6, second doped region 22 extends across both upper portion 18 and lower portion 24 of semiconductor wafer fragment 10. However, in the shown embodiment, second doped portion 22 does not extend entirely to bottom 14 of semiconductor wafer 10. Accordingly, second dopant 20 is provided to a greater concentration in upper portion 18 than in parts of lower portion 24 which are below second doped portion 22.

Referring to FIG. 7, lower portion 24 is removed to form a stencil mask 40. An example method for removing lower portion 24 is an electrochemical etch, such as the etch method described in U.S. patent application Ser. No. 08/916, 818, filed Aug. 22, 1997, and assigned to Micron Technology, Inc. U.S. patent application Ser. No. 08/916, 818 is hereby incorporated by reference. An electrochemical etch can selectively remove p-type doped semiconductive material from semiconductor wafer fragment 10 to form the shown stencil mask 40 which comprises only the n-type doped region 18. Stencil mask 40 is shown in a fragmentary view different than that of wafer fragment 10 of FIGS. 1–6. The portion of stencil mask 40 corresponding to wafer fragment 10 is illustrated by the dashed line labeled "10".

Stencil mask 40 comprises first and second dopants 16 (FIG. 1) and 20 (FIG. 3) along peripheries 28 of openings 26. Such dopants can provide compressive and tensile forces within the peripheries to maintain dimensions of openings 26.

Although the embodiment described with reference to FIGS. 1–7 comprises providing two different dopants having different ionic radii within a semiconductor wafer before removing a portion of the wafer to form a stencil mask, it is to be understood that the invention also encompasses methods in which one or both of such dopants are provided after removing a portion of the wafer to form a stencil mask.

Also, although the preferred embodiment described above with reference to FIGS. 1–7 utilizes a first thermal processing treatment after provision of a first dopant, and a second thermal processing treatment after provision of a second dopant, the invention also encompasses methods in which only one thermal treatment is utilized, and methods in which no thermal treatments are utilized. For instance, in embodiments in which first dopant 16 (FIG. 1) is an n-type dopant and second dopant 20 (FIG. 3) is a p-type dopant, it is preferred to eliminate the first thermal processing treatment.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of maintaining dimensions of an opening in a semiconductive material stencil mask comprising providing two different dopants and a background dopant within a periphery of the stencil mask opening in the semiconductive material, the two different dopants each being provided to a concentration of at least about $10^{17}$ atoms/cm$^3$ and at least one of the two different dopants having the same conductivity type as the background dopant.

2. The method of claim 1 wherein one of the two different dopants is an n-type dopant and the other is a p-type dopant.

3. The method of claim 1 further comprising forming the opening in the semiconductive material stencil mask, and wherein at least one of the two different dopants is provided before the opening is formed.

4. The method of claim 1 further comprising forming the opening in the semiconductive material stencil mask, and wherein at least one of the two different dopants is provided after the opening is formed.

5. The method of claim 1 wherein one of the two different dopants comprises an atomic radii larger than an atomic radii of the semiconductive material, and wherein the other of the two different dopants comprises an atomic radii smaller than the atomic radii of the semiconductive material.

6. A method of manufacturing a stencil mask from a semiconductive material comprising:

providing a semiconductive material stencil mask substrate having openings formed therethrough and having a concentration of a background dopant of a first conductivity type;

providing a first dopant of a second conductivity type within at least a portion of the substrate, the first dopant being provided to a concentration which exceeds the background dopant concentration; and providing a second dopant of the first conductivity type within the portion of the substrate, the second dopant being provided to a concentration which exceeds the background dopant concentration.

7. The method of claim 6 wherein the semiconductive material comprises monocrystalline silicon.

8. The method of claim 6 wherein the first dopant is an n-type dopant and the second dopant is a p-type dopant.

9. The method of claim 6 wherein the first dopant is an n-type dopant, the second dopant is a p-type dopant, and the background dopant is a p-type dopant.

10. The method of claim 6 wherein the first dopant comprises an atomic radii larger than an atomic radii of the semiconductive material, and wherein the second dopant comprises an atomic radii smaller than the atomic radii of the semiconductive material.

11. The method of claim 6 wherein the first dopant comprises an atomic radii larger than an atomic radii of the semiconductive material, wherein the second dopant comprises an atomic radii smaller than the atomic radii of the semiconductive material, and wherein the provision of the first and second dopants comprises, in the following sequence:

implanting the first dopant into the semiconductive material;

thermally treating the semiconductive material after the implanting, the thermal treatment diffusing the first dopant within the semiconductive material; and implanting the second dopant into the semiconductive material.

12. A method of manufacturing a stencil mask from a semiconductive material comprising:

providing a semiconductive material wafer, the wafer comprising an upper portion and a lower portion beneath the upper portion and a background dopant of a first conductivity type;

forming openings extending through the upper portion of the wafer and to the lower portion of the wafer;

forming a concentration of a first dopant of a second conductivity type within the wafer, the first dopant concentration being greater within the upper portion of the wafer than within at least a part of the lower portion of the wafer;

providing a concentration of a second dopant of the first conductivity type within the upper portion of the wafer; and removing the lower portion of the wafer to leave a stencil mask substrate having openings formed therethrough.

13. The method of claim 12 wherein one of the first and second conductivity types comprises n-type and the other comprises p-type.

14. The method of claim 12 wherein the first dopant is a p-type dopant and the second dopant is an n-type dopant.

15. The method of claim 12 wherein at least one of the first and second dopant concentrations is provided before the openings are formed.

16. The method of claim 12 wherein at least one of the first and second dopant concentrations is provided before the lower portion is removed.

17. A method of manufacturing a stencil mask from a semiconductive material comprising:

providing a semiconductive material having a top surface and a bottom surface, the semiconductive material comprising monocrystalline silicon and having a background p-type dopant concentration;

providing a first dopant at the top surface and within the semiconductive material to form a doped upper portion within the semiconductive material, the first dopant being an n-type dopant;

defining a lower portion of the semiconductive material as a portion extending from the botton surface to the doped upper portion;

providing a second dopant at the top surface and within the doped upper portion of the semiconductive material, the second dopant being a p-type dopant and provided to a concentration greater than the background p-type dopant concentration;

forming openings through the upper portion of the semiconductive material and to the lower portion, the openings being defined by peripheries comprising the semiconductive material, the peripheries further comprising the first and second dopants; and removing the lower portion of the semiconductive material to form a stencil mask having the openings extending therethrough.

18. The method of claim 17 wherein the removing the lower portion comprises electrochemical etching.

19. The method of claim 17 wherein the first dopant is blanket implanted into an entirety of the top surface of the semiconductive material.

20. The method of claim 17 wherein the second dopant is blanket implanted into an entirety of the top surface of the semiconductive material.

21. The method of claim 17 wherein the first and second dopants are blanket implanted into an entirety of the top surface of the semiconductive material.

22. The method of claim 17 wherein the first dopant has an atomic radii larger than an atomic radii of the semiconductive material, and wherein the second dopant has an atomic radii smaller than an atomic radii of the semiconductive material.

23. The method of claim 17 wherein the first dopant has an atomic radii larger than an atomic radii of the semiconductive material, and wherein the second dopant is a p-type dopant having an atomic radii smaller than an atomic radii of the semiconductive material.

24. The method of claim 17 wherein the first dopant has an atomic radii larger than an atomic radii of the semiconductive material, and wherein the second dopant has an atomic radii smaller than an atomic radii of the semiconductive material, the providing the first and second dopants comprising, in following the sequence:

providing the second dopant less deep within the semiconductive material than the first dopant; and thermally treating the semiconductive material to diffuse the second dopant and the first dopant within the semiconductive material.

25. The method of claim 17 wherein the first dopant has an atomic radii larger than an atomic radii of the semiconductive material, and wherein the second dopant has an atomic radii smaller than an atomic radii of the semiconductive material, the providing the first and second dopants comprising, in the following sequence:

blanket implanting the first dopant into an entirety of the upper surface of the semiconductive material to a first depth within the semiconductive material;

thermally treating the semiconductive material to diffuse the first dopant to a second depth within the semiconductive material, the second depth being greater than the first depth;

blanket implanting the second dopant into an entirety of the upper surface of the semiconductive material to a third depth within the semiconductive material, the third depth being less deep than the second depth; and thermally treating the semiconductive material to diffuse the first and second dopants to a fourth and fifth depths, respectively, within the semiconductive material, the fourth depth being deeper than the second depth, and the fifth depth being deeper than the third depth.

26. The method of claim 25 wherein the third depth is less deep than the first depth.

27. The method of claim 25 wherein the second dopant comprises a p-type dopant and wherein the fourth depth is deeper than the fifth depth.

28. The method of claim 17 wherein the semiconductive material comprises silicon, the first dopant comprises arsenic, and the second dopant comprises boron.

29. A semiconductive material stencil mask comprising:

a semiconductive material substrate having an opening therethrough, the opening being defined by a periphery comprising the semiconductive material; and two different dopants within the semiconductive material at the periphery, the two different dopants being of a same conductivity type and at least one of the dopants being a background dopant.

30. The stencil mask of claim 29 wherein the semiconductive material comprises monocrystalline silicon.

31. The stencil mask of claim 29 wherein the two different dopants are n-type dopants.

32. The stencil mask of claim 31 further comprising a plurality of openings having peripheries and having the two different n-type dopants at the peripheries.

33. The stencil mask of claim 31 further comprising a p-type dopant at the periphery.

34. The stencil mask of claim 31 wherein one of the two n-type dopants comprises an atomic radii larger than an atomic radii of the semiconductive material, and wherein the other of the two n-type dopants comprises an atomic radii smaller than the atomic radii of the semiconductive material.

35. The stencil mask of claim 29 wherein the two different dopants are p-type dopants.

36. The stencil mask of claim 35 further comprising a plurality of openings having peripheries and having the two different p-type dopants at the peripheries.

37. The stencil mask of claim 35 further comprising an n-type dopant at the periphery.

38. The stencil mask of claim 35 wherein one of the two p-type dopants comprises an atomic radii larger than an atomic radii of the semiconductive material, and wherein the other of the two p-type dopants comprises an atomic radii smaller than the atomic radii of the semiconductive material.

* * * * *